(12) United States Patent
Kawajiri

(10) Patent No.: US 11,719,774 B2
(45) Date of Patent: Aug. 8, 2023

(54) IMAGE PROCESSING APPARATUS, MRI APPARATUS, AND IMAGE PROCESSING SYSTEM

(71) Applicant: CANON MEDICAL SYSTEMS CORPORATION, Otawara (JP)

(72) Inventor: Sho Kawajiri, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/575,805

(22) Filed: Jan. 14, 2022

(65) Prior Publication Data

US 2022/0229127 A1 Jul. 21, 2022

(30) Foreign Application Priority Data

Jan. 15, 2021 (JP) .................. 2021-005334

(51) Int. Cl.
*G01R 33/28* (2006.01)
*G01R 33/54* (2006.01)
*G01R 33/30* (2006.01)
*G06T 7/73* (2017.01)
*G01R 33/34* (2006.01)

(52) U.S. Cl.
CPC ......... *G01R 33/283* (2013.01); *G01R 33/307* (2013.01); *G01R 33/34007* (2013.01); *G01R 33/543* (2013.01); *G06T 7/73* (2017.01); *G06T 2207/30204* (2013.01)

(58) Field of Classification Search
CPC ............... G01R 33/283; G01R 33/307; G01R 33/34007; G01R 33/543; G01R 33/3415; G01R 33/3664; G01R 33/3692; G01R 33/546; G06T 7/73; G06T 2207/30204; G06T 2207/30004; G06T 7/70; A61B 5/0033; A61B 5/055
See application file for complete search history.

(56) References Cited

U.S. PATENT DOCUMENTS

2009/0021257 A1 1/2009 Yasuhara
2010/0156421 A1* 6/2010 Sukkau ............... G01R 33/3415
324/318

FOREIGN PATENT DOCUMENTS

JP 2009-39519 A 2/2009

* cited by examiner

*Primary Examiner* — G. M. A Hyder
(74) *Attorney, Agent, or Firm* — Oblon, McClelland, Maier & Neustadt, L.L.P.

(57) ABSTRACT

In one embodiment, an image processing apparatus includes processing circuitry. The processing circuitry acquires an image in which a coil is depicted. The processing circuitry acquires, from the image, information on disposition of the coil and information on a port to which the coil is connected.

20 Claims, 12 Drawing Sheets

IMAGE PROCESSING APPARATUS, MRI APPARATUS, AND IMAGE PROCESSING SYSTEM

CROSS-REFERENCE TO RELATED APPLICATIONS

This application claims the benefit of priority of Japanese Patent Application No. 2021-005334, filed Jan. 15, 2021, the entire contents of which are incorporated herein by reference.

FIELD

Disclosed Embodiments relate to an image processing apparatus, a magnetic resonance imaging (MRI) apparatus, and an image processing system.

BACKGROUND

An MRI apparatus is an imaging apparatus which magnetically excites nuclear spin of an object placed in a static magnetic field with a radio frequency (RF) signal having the Larmor frequency and reconstructs an image on the basis of magnetic resonance (MR) signals emitted from the object due to the excitation. An MRI apparatus can acquire MR signals from an object non-invasively.

In a system including an MRI apparatus and an optical camera, there is a technique for utilizing an image acquired by the optical camera. This system can display a setting image of an RF coil placed on or near the surface of the object and an image that shows setting support information including the position of a virtual magnetic field center.

DETAILED DESCRIPTION

Hereinbelow, embodiments of an image processing apparatus, an MRI apparatus, and an image processing system will be described in detail by referring to the accompanying drawings.

In one embodiment, an image processing apparatus includes processing circuitry. The processing circuitry acquires an image in which a coil is depicted. Additionally, the processing circuitry acquires information on disposition of the coil and information on a port to which the coil is connected from the image.

Figure 1:
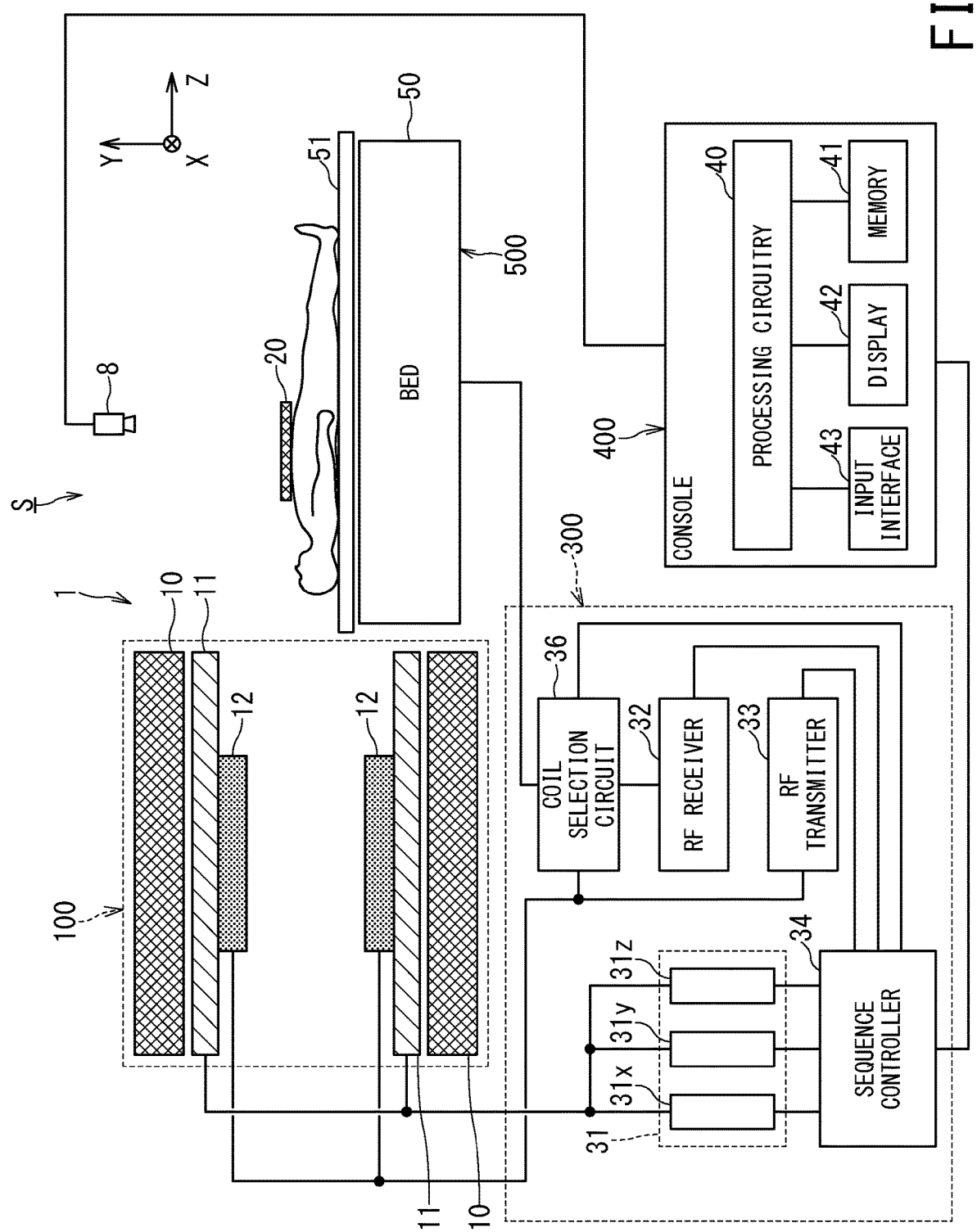
FIG. 1 is a block diagram illustrating an overall configuration of an image processing system according to one embodiment.

FIG. 1 is a block diagram illustrating an overall configuration of an image processing system S according to the present embodiment. The image processing system S according to the present embodiment includes an MRI apparatus 1 and an optical camera 8. The MRI apparatus 1 includes components such as a gantry 100, a control cabinet 300, an image processing apparatus (for example, console) 400, and a bed 500.

The gantry 100 and the bed 500 are disposed in a shield room, in general. The control cabinet 300 is disposed in a machine room, for example, and the console 400 is disposed in an operation room.

The gantry 100 includes, for example, a static magnetic field magnet 10, a gradient coil assembly 11, a WB (Whole Body) coil 12, and these components are included in a cylindrical housing. The bed 500 includes a bed body 50 and a table 51. Additionally, The MRI apparatus 1 further includes an RF coil 20 that is attached near an object. Although a description will be given of the case where the RF coil 20 is one of the components of the MRI apparatus 1 in the following, the RF coil 20 may not be included in the configuration of the MRI apparatus 1. In this case, though the RF coil 20 is not included in the configuration of the MRI apparatus 1, the RF coil 20 and the MRI apparatus 1 are configured to be connectable to each other. More specifically, the RF coil 20 and the table 51 of the MRI apparatus 1 are configured to be connectable to each other.

The control cabinet 300 includes gradient coil power supplies 31 (to be exact, 31x for the X-axis, 31y for the Y-axis, and 31z for the Z-axis), an RF receiver 32, an RF transmitter 33, a sequence controller 34, and a coil selection circuit 36.

The static magnetic field magnet 10 of the gantry 100 is substantially in the form of a cylinder, and generates a static magnetic field inside the bore (i.e., the space inside the cylindrical structure of the static magnetic field magnet 10) which is an imaging region of an object (for example, a patient). The static magnetic field magnet 10 includes a superconducting coil inside, and the superconducting coil is cooled down to an extremely low temperature by liquid helium.

The static magnetic field magnet 10 generates a static magnetic field by supplying the superconducting coil with electric current provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. Note that the static magnetic field magnet 10 may be configured as a permanent magnet.

The gradient coil assembly 11 is also substantially in the form of a cylinder, and is fixed to the inside of the static magnetic field magnet 10. The gradient coil assembly 11 is composed of three gradient coils for the X-axis, Y-axis, and Z-axis. Those three gradient coils are supplied with electric currents from the respective gradient coil power supplies 31$x$, 31$y$, and 31$z$ so as to generate gradient magnetic fields in the X-axis, Y-axis, and Z-axis directions, and the generate gradient magnetic fields are applied to the object.

The bed body 50 of the bed 500 can move the table 51 in the upward and downward directions, and moves the table 51 with the object loaded thereon to a predetermined height before imaging. Afterward, at the time of imaging, the bed body 50 moves the table 51 in the horizontal direction so as to move the object inside the bore.

The WB body coil is shaped substantially in the form of a cylinder so as to surround an object, and is fixed to the inside of the gradient coil assembly 11. The WB coil 12 applies an RF pulse transmitted from the RF transmitter 33 to the object, and receives MR signals emitted from the object due to excitation of hydrogen nuclei.

The RF coil 20 receives MR signals emitted from the object at a position close to the object. The RF coil 20 according to the present embodiment includes a plurality of coil elements EL. There are various models for the RF coil 20 such as a head coil, a chest coil, a spine coil, a lower-limb coil, and a whole-body coil depending on an anatomical imaging part of the object. Further, a plurality of RF coils 20 can be attached to the object at the same time. FIG. 1 illustrates a case in which an RF coil 20 for the chest (hereinafter, referred to as a "chest coil") is attached.

The RF transmitter 33 transmits RF pulses to the WB coil 12 on the basis of commands inputted from the sequence controller 34. The coil selection circuit 36 selects the MR signals received by the WB coil 12 and/or the MR signals received by the RF coil 20, and transmits the MR signals to the RF receiver 32. The RF receiver 32 receives MR signals received by the WB coil 12 and/or the RF coil 20, and transmits raw data obtained by digitizing the received MR signals to the sequence controller 34.

The sequence controller 34 performs a scan of the object by driving the gradient coil power supplies 31, the RF transmitter 33, and the RF receiver 32 under the control of the console 400. When the sequence controller 34 receives the raw data from the RF receiver 32 by performing a scan, the sequence controller 34 transmits the received raw data to the console 400.

The sequence controller 34 includes processing circuitry (not shown), which is configured as hardware such as a processor configured to execute predetermined programs, a field programmable gate array (FPGA), and an application specific integrated circuit (ASIC).

The console 400 is configured as a computer including processing circuitry 40, a memory 41, a display 42, and an input interface 43. The console 400 is one of the aspects of an image processing apparatus.

The memory 41 is a recording medium including a read-only memory (ROM) and a random access memory (RAM) in addition to an external memory device such as a hard disk drive (HDD) and an optical disc device. The memory 41 stores various programs to be executed by a processor of the processing circuitry 40 in addition to various data and information. For example, the memory 41 stores a database of various RF coils. In this database, an optical image of each RF coil and the arrangement information of a plurality of coil elements included in this RF coil are associated with each other.

The display 42 is a display device such as a liquid crystal display panel, a plasma display panel, and an organic EL panel. The input interface 43 includes various devices for an operator to input various data and information, and is configured of, for example, a mouse, a keyboard, a trackball, and/or a touch panel.

The processing circuitry 40 is, for example, a circuit provided with a CPU and/or a special-purpose or general-purpose processor. The processor implements various functions described below by executing programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 by working these components. The processing circuitry 40 causes the sequence controller 34 to perform a scan on the basis of inputted imaging conditions, and reconstructs images on the basis of the raw data (i.e., digitized MR signals) inputted from the sequence controller 34. The reconstructed images are displayed on the display 42 and stored in the memory 41.

The optical camera 8 is installed, for example, on the ceiling of the imaging room where the MRI apparatus 1 is installed. The optical camera 8 includes components such as a lens, an image sensor, an amplifier, and an A/D (Analog to Digital) converter (not shown). The lens is an optical element for refracting and focusing light. The image sensor images the RF coil 20 as an imaging target via an objective optical system (not shown). The amplifier amplifies an output video signal from the image sensor. The A/D converter converts the analog video signal outputted from the amplifier into a digital signal. The optical camera 8 is connected to the processing circuitry 40, and outputs the acquired image as a digital signal to the processing circuitry 40.

The optical camera 8 images all or part of the table 51 before entering the gantry 100 from above, and acquires an image of the RF coil 20 that is attached to the object placed on the table 51. For example, the optical camera 8 can acquire a moving image of the RF coil 20 obtained by time-sequentially imaging all or part of the table 51 at a predetermined frame rate.

The lens of the optical camera 8 may be a standard lens or a so-called wide-angle lens having a wider angle of view than the standard lens. Disposition of the optical camera 8 is not limited to being installed on the ceiling. The optical camera 8 may be fixed to, for example, a cover (including the inside of the bore) covering the gantry 100 or the end of the gantry 100. The optical camera 8 may also be attached to the gantry 100 or the wall near the gantry 100.

Figure 2:
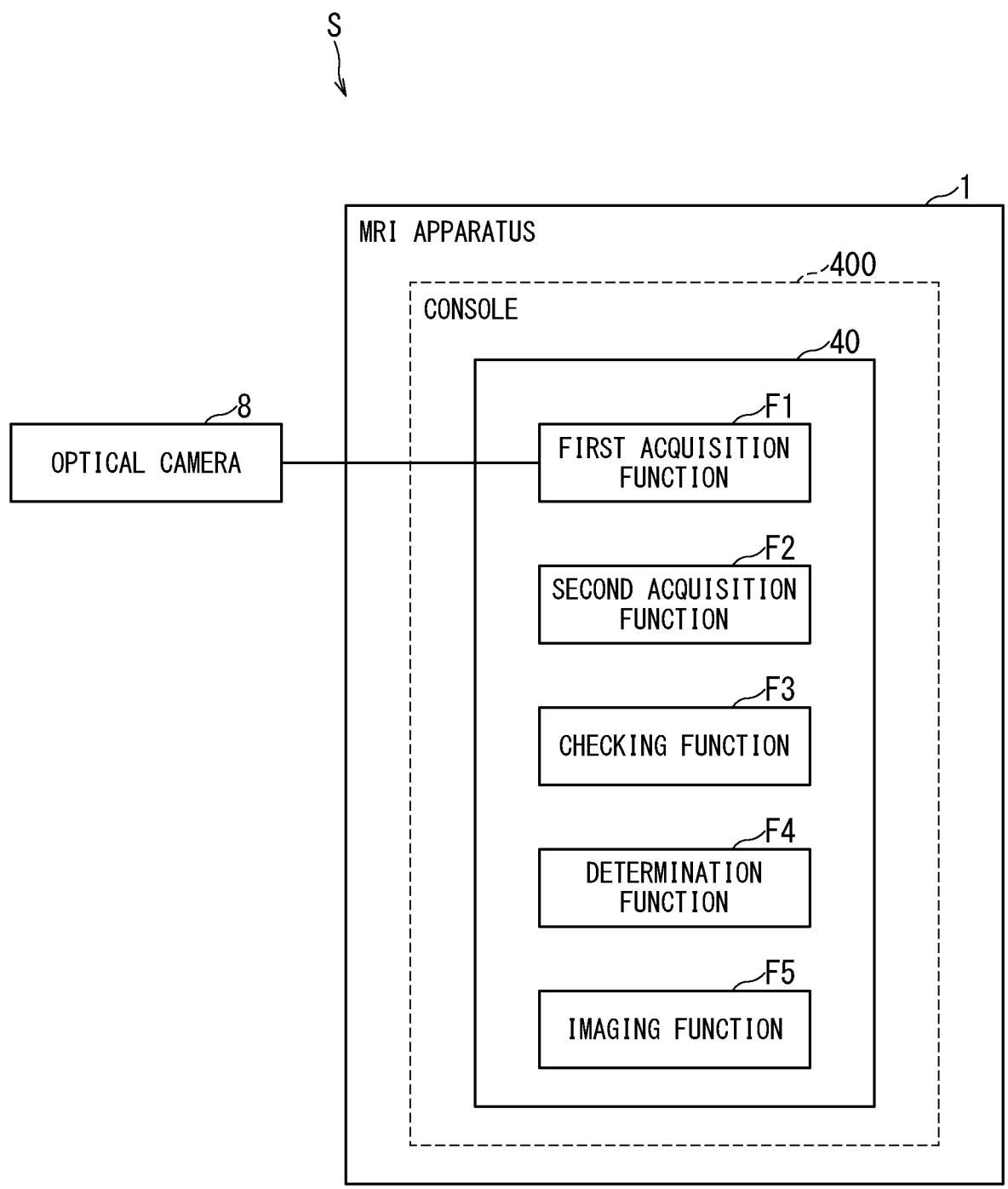
FIG. 2 is a block diagram illustrating functions of the image processing system.

FIG. 2 is a block diagram illustrating the functions of the image processing system S.

As shown in FIG. 2, the processing circuitry 40 reads out and executes the computer programs stored in the memory 41 or directly incorporated in the processing circuitry 40 so as to implement a first acquisition function F1, a second acquisition function F2, a checking function F3, a determination function F4, and an imaging function F5. Although a description will be given of a case where the functions F1 to F5 function as software by executing the computer programs in the following, all or some of the functions F1 to F5 may be implemented by a circuit such as an ASIC. Further, the functions F1 to F4 may be provided in another computer other than the console 400 having the imaging function F5, for example, may be provided in a tablet computer.

The first acquisition function F1 includes a function of time-sequentially acquiring optical images, each of which depicts the RF coil 20 attached to the object (for example, the chest coil attached to the object placed on the table 51), by using the optical camera 8.

The second acquisition function F2 includes a function of acquiring both of information on the disposition of the RF coil 20 and information on the port to which the RF coil 20 is connected, and both are acquired from the optical image acquired by the first acquisition function F1. The information on the disposition of the RF coil 20 includes the position of the RF coil 20 with respect to the table 51 and the orientation of the RF coil with respect to the table 51.

The checking function F3 includes a function of asking a user whether the port information on which is acquired as the connection destination of each of the plurality of RF coils by the second acquisition function F2 is the correct port or not, via an image indicating such a question or via voice indicating such a question immediately before the table 51 with the object placed thereon begins to move to the magnetic field center.

The determination function F4 includes a determination function of determining the coil element(s) to be used for MR imaging from among the plurality of coil elements 20EL of the RF coil 20 connected to the port information on which is acquired by the second acquisition function F2, and this determination function is achieved on the basis of the position of the RF coil 20 with respect to the table 51, the orientation of the RF coil 20 with respect to the table 51, and the positional relationship between the magnetic field center and the table 51.

The imaging function F5 includes: a function of setting the imaging range (Field of View, hereinafter referred to as FOV) and the positional relationship between the magnetic field center and the table 51 on the basis of the imaging conditions; and a function of moving the table 51 with the object placed thereon to the magnetic field center to achieve the positional relationship having been set and then performing MR imaging.

Figure 3A:
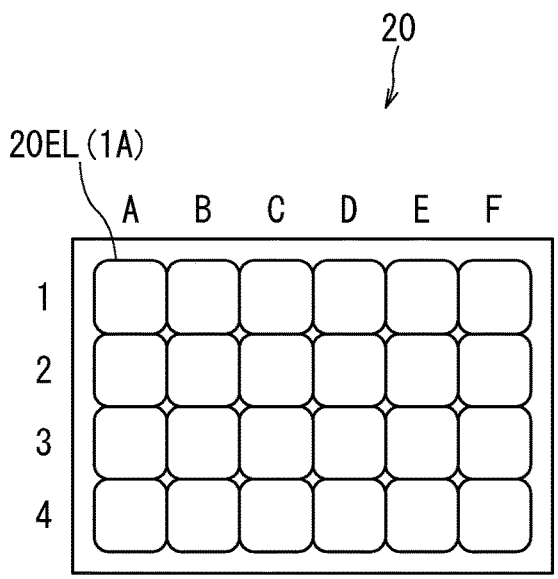
FIG. 3A is a schematic diagram illustrating one example of arrangement information of coil elements of an RF coil.
Figure 3B:
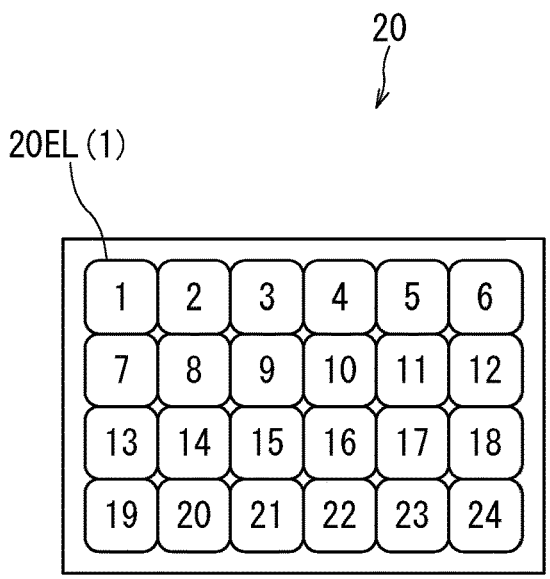
FIG. 3B is a schematic diagram illustrating another example of the arrangement information of the coil elements of the RF coil.

FIG. 3A and FIG. 3B are schematic diagrams illustrating one case and another case of how to hold arrangement information of coil elements 20EL of the RF coil 20. Each of FIG. 3A and FIG. 3B illustrates a case where the RF coil 20 has 24 coil elements 20EL.

On the basis of the optical image generated by the optical camera 8, the processing circuitry 40 of the console 400 according to the present embodiment recognizes at which position of the table 51 the respective coil elements 20EL are arranged, and then selects the appropriate coil element(s) 20EL in accordance with the imaging position of MR imaging.

Thus, the processing circuitry 40 not only detects the RF coil 20 from the optical image generated by the optical camera 8 but also recognizes the arrangement positions of the respective coil elements 20EL on the basis of the optical image. Preferably, the memory 41 stores a database in which the optical image of each of the various RF coils 20 is associated with the arrangement information of the plurality of the coil elements 20EL included in each RF coil 20 such that the arrangement information of the coil element 20EL can be obtained from the imaged RF coil 20 obtained by the optical camera 8 (FIG. 3A and FIG. 3B).

Figure 4:
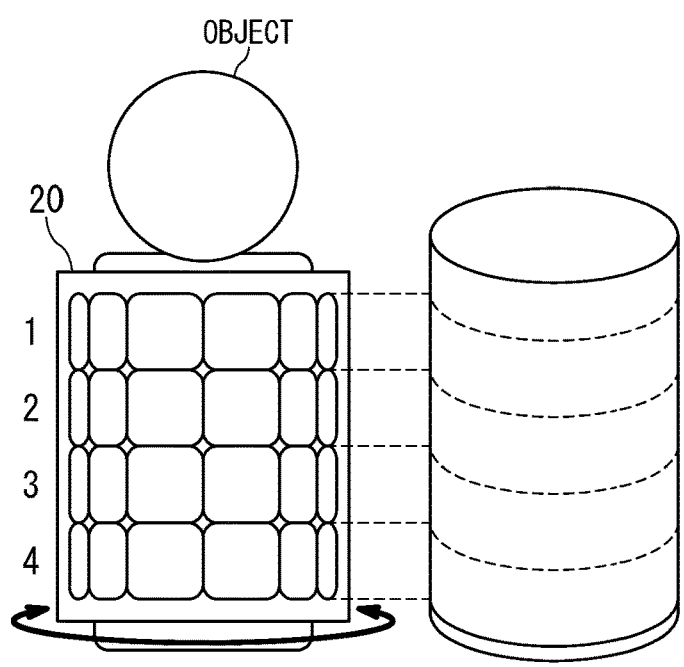
FIG. 4 is a schematic diagram illustrating appearance of the coil elements of the RF coil that is used by being wrapped around an object.

FIG. 4 is a schematic diagram illustrating appearance of the coil elements 20EL of the RF coil 20 that is used by being wrapped around the object.

Of the RF coils 20, the body coil and the flex coil are used by being wrapped around the body of the object. Thus, the coil elements EL arranged in the radial direction is deformed. Hence, it is difficult to predict the position of each coil element EL only from the appearance of the RF coil 20.

Assuming that the RF coil 20 wrapped around the object has a cylindrical shape in normal MR imaging, selection of the coil elements 20EL to be used for MR imaging is segmented in the axial direction. Thus, it is important to correctly deploy the coil element group, which is disposed in the axial direction of the RF coil 20 and has not changed in shape, and to be able to identify the position of the axial coil element group in the table 51 (FIG. 4).

Hence, for the convenience of segmentation in the axial direction, it is better to classify the respective coil elements 20EL by two-dimensional coordinates as shown in FIG. 3A rather than assigning an individual ID number to each coil element 20EL and classifying each coil element 20EL as 20EL(1), 20EL(2), . . . , 20EL(24) as shown in FIG. 3B.

In the following description, as shown in FIG. 3A, the coil elements 20EL are classified by two-dimensional coordinates, and each coil element 20EL is represented by 20EL ("row number" "column number") such as 20EL(1A), 20EL (1B), . . . , 20EL(4E), and 20EL(4F) by using the row number and column number to which the coil element 20EL belongs.

Figure 5:
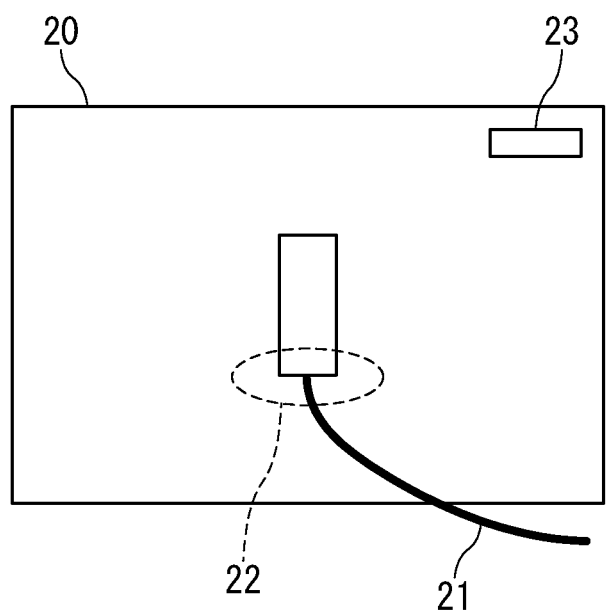
FIG. 5 is a schematic diagram illustrating a configuration of an RF coil.

FIG. 5 is a schematic diagram illustrating a configuration of the RF coil 20.

In general, many RF coils 20 have a line-symmetrical shape such as a rectangle and a cylinder. Thus, the second acquisition function F2 of the processing circuitry 40 according to the present embodiment recognizes the orientation of the RF coil 20 on the basis of the feature point that indicates a structurally asymmetrical part of the RF coil 20.

For example, when the RF coil 20 is a wired coil, the RF coil 20 has a cable 21 for being connected to the system as shown in FIG. 5. In this case, the second acquisition function F2 can acquire information on the orientation of the RF coil 20 by using the outlet 22 of the cable 21 as the feature point. Further, the second acquisition function F2 may acquire information on the orientation of the RF coil 20 on the basis of the label 23 and/or the mark attached to the RF coil 20 and another characteristic shape portion of the RF coil 20.

When the RF coil 20 is bent further tightly and the model name or coil type of the RF coil 20 cannot be identified from the optical image, the second acquisition function F2 may obtain positions of the respective coil elements 20EL by using coil type that can be determined by the coil type information outputted from the RF coil 20 when the RF coil 20 is connected to the system.

When a plurality of RF coils 20 are included in the optical image, it is desirable to associate the position information on each RF coil 20 with the information as to which coil port of the table 51 each RF coil 20 is connected to.

Hereinafter, a description will be given of three methods of associating the position information of the RF coil 20 with the coil port to which the RF coil 20 is connected.

Figure 6C:
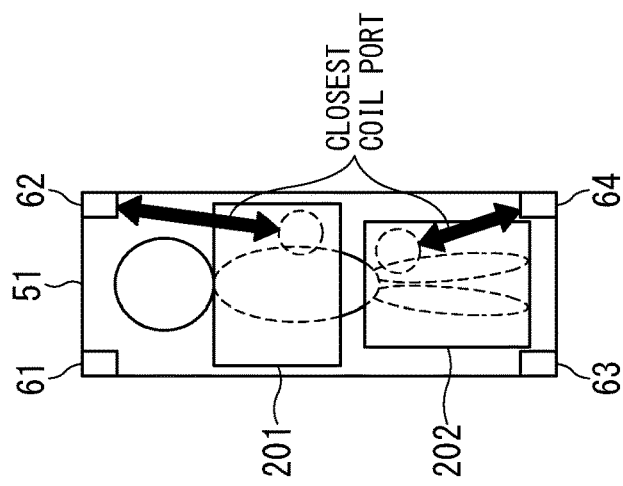
FIG. 6C is a schematic diagram illustrating the third method of associating position information of the RF coil 20 with the coil port to which the RF coil 20 is connected.
Figure 6B:
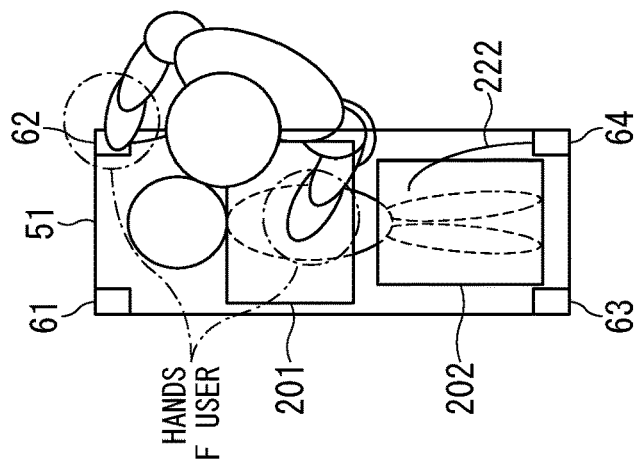
FIG. 6B is a schematic diagram illustrating the second method of associating position information of the RF coil 20 with the coil port to which the RF coil 20 is connected.
Figure 6A:
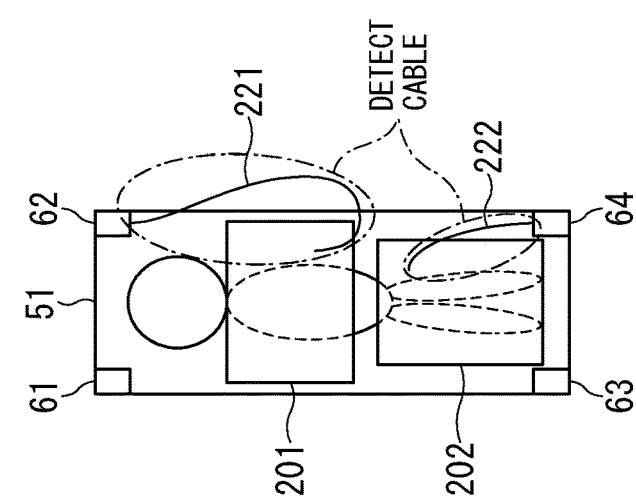
FIG. 6A is a schematic diagram illustrating the first method of associating position information of the RF coil 20 with the coil port to which the RF coil 20 is connected.

FIG. 6A, FIG. 6B, and FIG. 6C are schematic diagrams for illustrating the first, second, and third methods of associating position information of the RF coil 20 with the coil port to which the RF coil 20 is connected, respectively. Each of FIG. 6A, FIG. 6B, and FIG. 6C illustrates a case where the optical image depicts two RF coils 20 including a first coil 201 and a second coil 202 and the table 51 has four coil ports including a first port 61, a second port 62, a third port 63, and a fourth port 64.

The first method is a method of detecting the routing (or wiring pattern) of the cable 21. In the first method, the first acquisition function F1 acquires an optical image that depicts the first coil 201 connected to the second port 62 via the cable 211 and the second coil 202 connected to the fourth port 64 via the cable 212 (FIG. 6A). For each of the first coil 201 and the second coil 202, the second acquisition function F2 can acquire the information of the coil port to which each coil is connected from the image acquired by the first acquisition function F1 on the basis of the respective positions of the cables 211 and 212 so as to associate each coil (201, 202) with the corresponding coil port.

The second method is a method of using the optical image for detecting the positions of both hands of the user such as a medical imaging technologist at the time of cable connection. At the time of connecting the cable 21 of the RF coil 20 to the coil port, the user generally connects the cable 21 to the coil port with the one hand while supporting the RF coil 20 with the other hand to prevent the RF coil 20 from being misaligned (FIG. 6B).

Accordingly, in response to conduction of electrical signals between each of the first and second coils (201, 202) and the system when the cable 21 is connected to the coil port, the first acquisition function F1 may acquire respective optical images of the first coil 201 and the second coil 202 when each of the first coil 201 and the second coil 202 is connected to the coil port via the cable (211, 212). In this case, on the basis of the positions of both hands of the user depicted in the optical images, the first acquisition function F1 associates each coil with the coil port by acquiring information on the coil port to which each coil is connected.

The third method is a method of associating an RF coil 20 with the coil port closest to this RF coil 20. When the coil port cannot be associated with each coil by the first method or the second method, the coil port closest to each RF coil may be acquired as the port to which this RF coil is connected so that each RF coil is associated with the acquired coil port (FIG. 6C).

Of these first to third methods, accuracy of association between each RF coil and the coil port is highest in the first method, followed by the second method, and lowest in the third method. The analysis capability required for the image processing software is highest in the first method, followed by the second method, and lowest in the third method.

Accordingly, for example, when the analysis capability of the image processing software is insufficient for implementing the first method, the second method or the third method may be used. The second method and the third method include the possibility of erroneous detection. Thus, when the second method or the third method is used, the information of the coil port to which each coil is connected may be reacquired immediately before the table 51 is moved to the magnetic field center after completion of coil setting in addition to acquiring the same information at the timing when the cable 21 is connected to the coil port.

Figure 7:
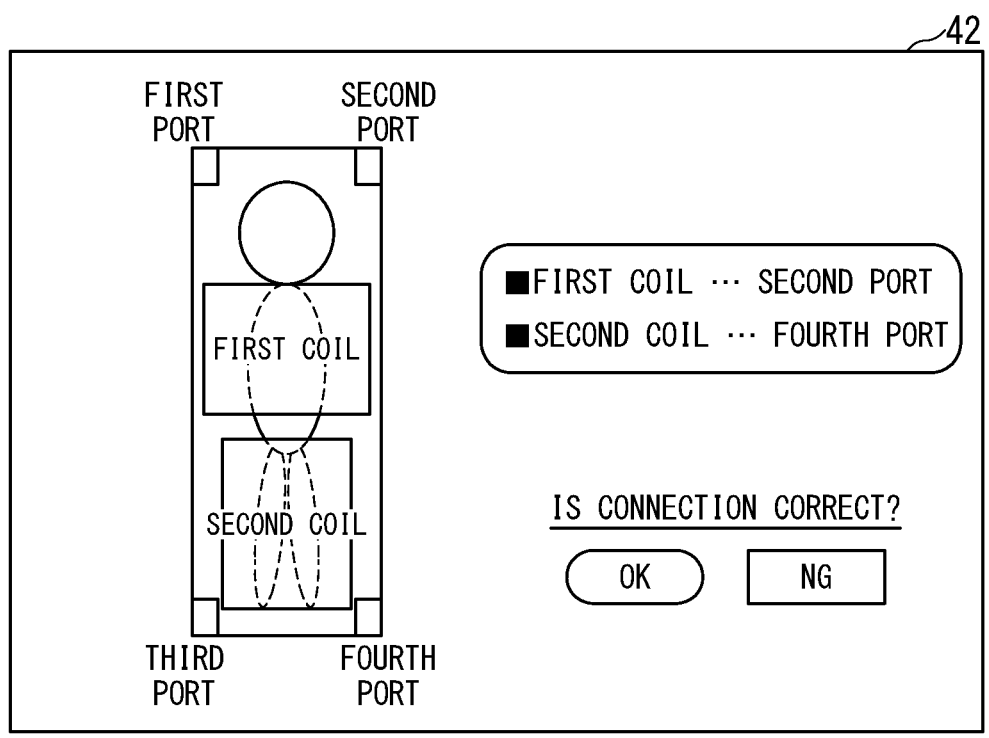
FIG. 7 is a schematic diagram illustrating a checking image to be used for determining whether the connection relationship between respective RF coils and the coil ports is correct or not.

FIG. 7 is a schematic diagram illustrating a checking image to be used for determining whether the connection relationship between the respective RF coils and the coil ports is correct or not.

The checking function F3 may ask the user whether the connection relationship between the respective RF coils and the coil ports acquired by the second acquisition function F2 is correct or not, immediately before movement of the table 51 to the magnetic field center. Specifically, the checking function F3 may generate a checking image as to whether the connection relationship between the respective RF coils and the coil ports is correct or not so as to display the checking image on the display 42 or on a monitor provided in the gantry 100, for example (FIG. 7). Additionally, the checking function F3 may cause a speaker (not shown) to output checking voice as to whether the connection relationship between the respective RF coils and the coil ports is correct or not.

Figure 8:
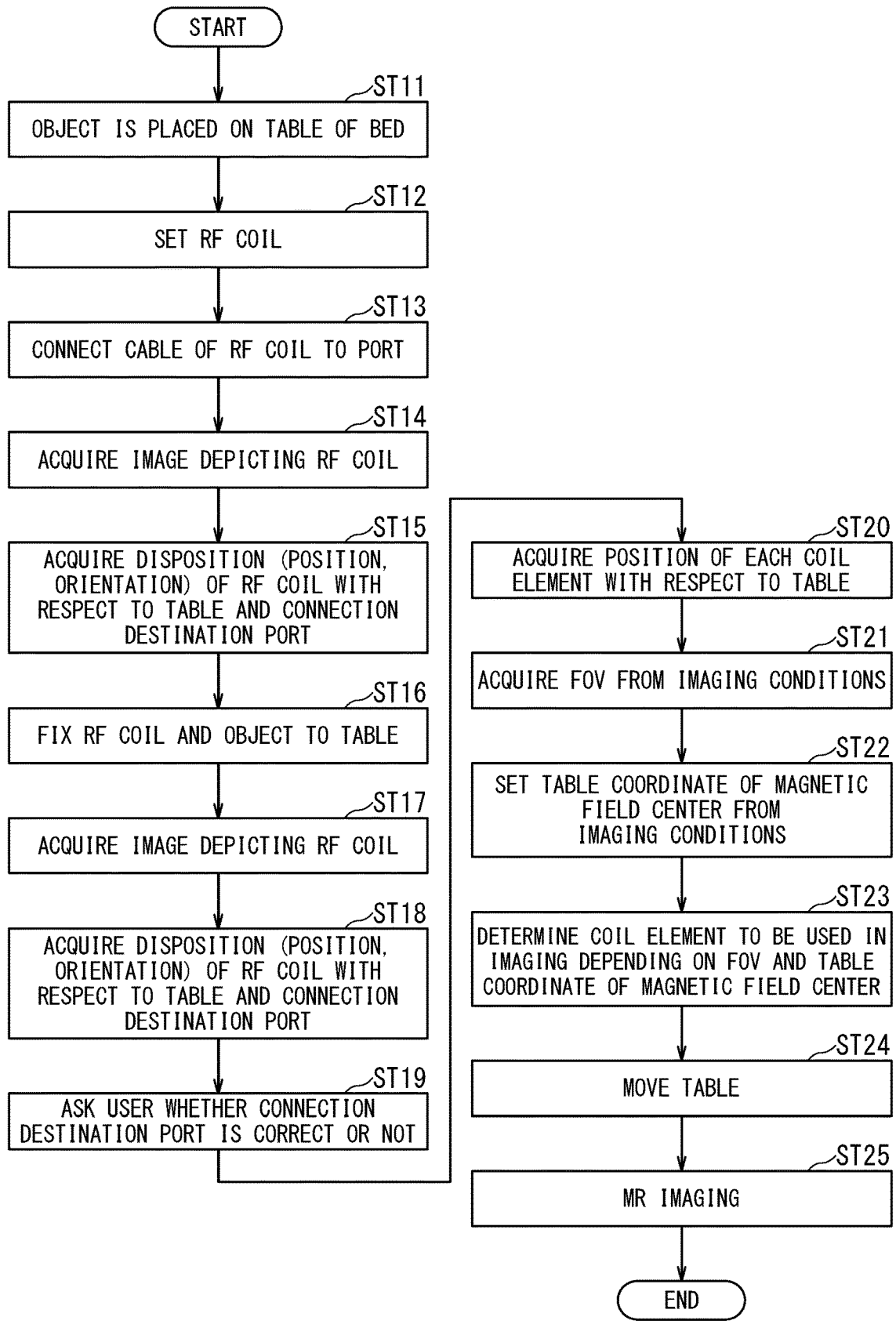
FIG. 8 is a flowchart illustrating a procedure for determining coil elements to be used in MR imaging on the basis of an optical image generated by an optical camera when the optical image depicts a plurality of RF coils.

FIG. 8 is a flowchart illustrating a procedure for determining coil elements to be used in MR imaging on the basis of the optical image generated by the optical camera 8 when the optical image depicts a plurality of RF coils 20.

Figure 9:
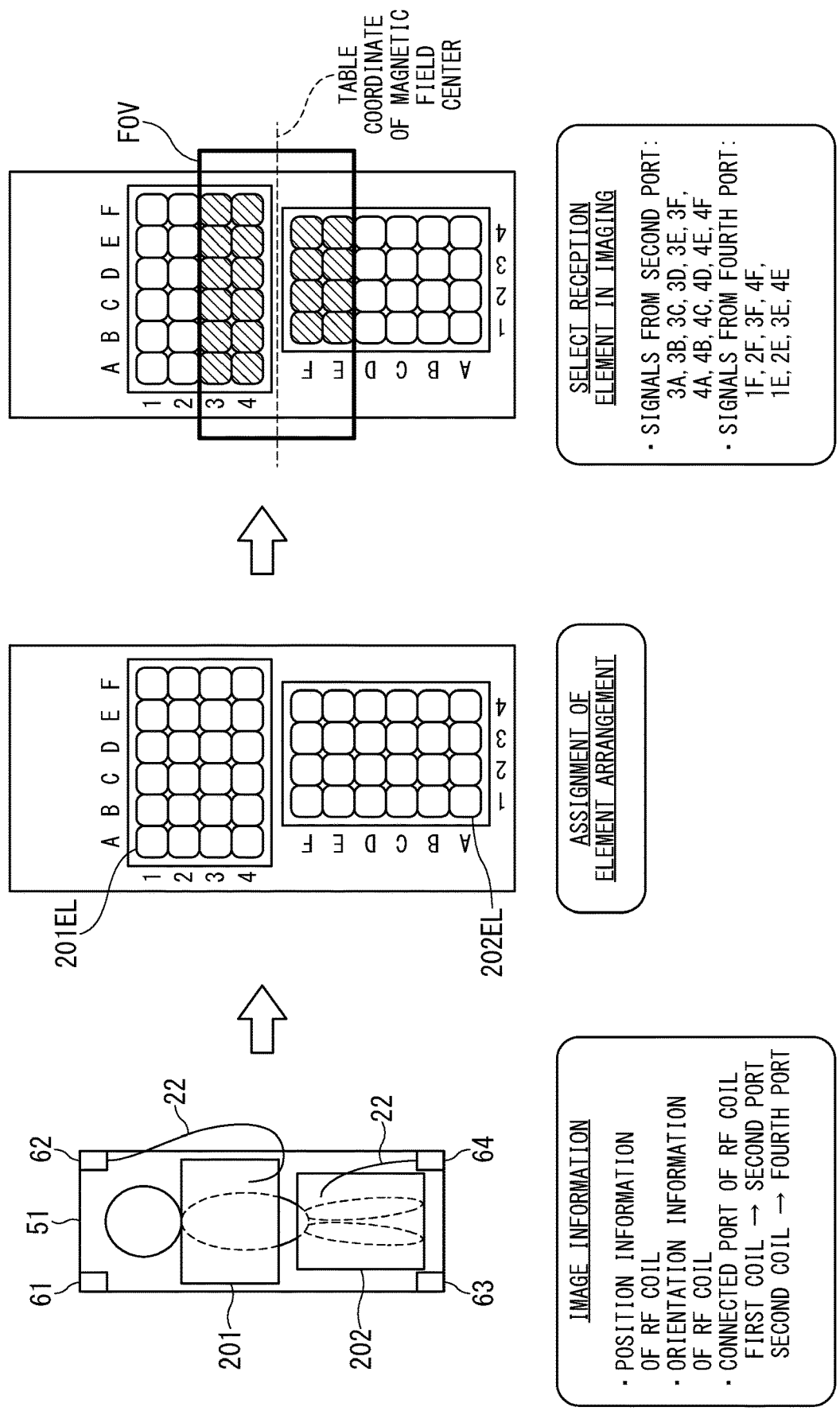
FIG. 9 is a schematic diagram illustrating coil elements that are to be used at the time of MR imaging and are determined by the procedure shown in FIG. 8.

FIG. 9 is a schematic diagram illustrating the coil elements 20EL that are to be used at the time of MR imaging and are determined by the procedure shown in FIG. 8.

First, in the step ST11, the object is placed on the table 51 of the bed 500. In the step ST11, the object is placed on the table 51 that is lowered in the vertical position, and then, the height of the table 51 is adjusted by raising the table 51 on which the object is placed. The detection of the RF coil 20 may be started in response to the detection that the object is placed on the table 51 on the basis of the camera image. After that, on the basis of the optical images to be time-sequentially acquired, the second acquisition function F2 may continue to detect the position and orientation of the RF coils 20 on the table 51 and the coil port to which each coil is connected. In this case, the detection frequency may be determined on the basis of the calculation amount of the image processing software and the processing capacity of the system.

In the next step ST12, two RF coils 20 including the first coil 201 and the second coil 202 are attached to the object placed on the table 51.

In the next step ST13, the cable 211 of the first coil 201 is connected to, for example, the second port 62. The approximate position and orientation of the RF coil 20 (i.e., first coil 201 in this case) as well as its connection destination, i.e., the coil port, may be provisionally determined when its cable 21 is connected to the coil port.

In this case, in the step ST14, in response to detection that the cable 21 of the RF coil 20 is connected to the coil port, the first acquisition function F1 acquires an optical image that depicts a plurality of coils and is generated at the moment of the connection.

In the step ST15, the second acquisition function F2 provisionally determines the position, orientation, and a port to which each RF coil 20 is connected (connection destination port for (connected port of) each RF coil 20). Specifically, the second acquisition function F2 acquires the disposition (i.e., position and orientation) of each RF coil 20 with respect to the table 51, uses at least one of the above-described first to third methods for acquiring information on the coil port to which each RF coil 20 is connected, and then associates the position information of each RF coil 20 with the coil port to which each RF coil 20 is connected. When the second method is used, the processing of the steps ST13 to ST15 is repeated every time one RF coil 20 is connected to the coil port.

In the next step ST16, each RF coil 20 and the object are fixed to the table 51 by using, for example, a band. When each RF coil 20 and the object are fixed to the table 51, it is estimated that the final position and orientation of each RF coil 20 have been determined.

In the next step ST17 subsequent to fixation of each RF coil 20 and the object to the table 51, the first acquisition function F1 acquires an optical image immediately before the position of the table 51 corresponding to the target imaging position of the object is moved to the magnetic field center.

In the next step ST18, the second acquisition function F2 performs main determination on the position, orientation, and connection destination port for each RF coil 20. Specifically, the second acquisition function F2 acquires the disposition (i.e., position and orientation) of each RF coil 20 with respect to the table 51. Further, the second acquisition function F2 uses at least one of the above-described first to third methods for acquiring the information of the coil port to which each RF coil 20 is connected so as to associate the position information of each RF coil 20 with the coil port to which each RF coil 20 is connected.

Although the provisional determination in the steps ST14 and ST15 and the main determination in the steps ST17 and ST18 may be executed in combination as shown in FIG. 8, it is sufficient if one of the provisional determination and the main determination is executed, i.e., the other of both may be omitted. In the case of executing the provisional determination in the steps ST14 and ST15, the second method shown in FIG. 6B can be used. In the case of executing the main determination in the steps ST17 and ST18, the latest position and orientation of the RF coil 20 can be detected.

In the next step ST19, immediately before the table 51 is moved to the magnetic field center, the checking function F3 asks the user whether the connection relationship between each RF coil 20 and the coil port acquired by the second acquisition function F2 is correct or not (FIG. 7). Since the connection relationship is checked by the user, adverse effects due to erroneous detection of the connection destination port can be prevented. Note that the step ST19 may be omitted. Execution of the processing of the steps ST11 to ST19 provides the position of each RF coil 20 with respect to the table 51, the orientation of each RF coil 20 with respect to the table 51, and the connection destination port of each RF coil 20 as shown on the left side of FIG. 9. Since the orientation of each RF coil 20 with respect to the table 51 is acquired, the respective positions of the coil elements 20EL with respect to the table 51 are also determined.

In the step ST20, on the basis of the position, orientation, and connection destination port of each RF coil 20, the second acquisition function F2 determines correspondence relationship between the coil ports and the arrangement of the coil elements 20EL of each RF coil 20 with respect to the position of the table 51 as shown in the middle of FIG. 9. Although the position of each RF coil 20 on the table 51 can be determined from the optical image, the electric signal of each coil element 20EL is determined by the coil port to which each RF coil 20 (201, 202) is connected. Thus, the result of associating each RF coil 20 with the connection destination port is also added to the arrangement information of the coil elements 20EL.

In the next step ST21, the imaging function F5 acquires the FOV on the basis of the imaging conditions.

In the next step ST22, the imaging function F5 sets the positional relationship between the magnetic field center and the table 51 on the basis of the imaging conditions. Specifically, the imaging function F5 sets the coordinate of the table 51 in the longitudinal direction, which is expected to be positioned at the magnetic field center in MR imaging, on the basis of the imaging conditions.

In the next step ST23, the determination function F4 determines the coil elements included in FOV as the coil elements to be used for MR imaging on the basis of: the position of each RF coil 20 with respect to the table 51; the orientation of each RF coil 20 with respect to the table 51; the coordinate of the table 51 in the longitudinal direction, which is expected to be positioned at the magnetic field center in MR imaging; and the FOV, as shown on the right side of FIG. 9.

In the next step ST24, the imaging function F5 causes the bed 500 to move the table 51 with the object placed thereon toward the inner side of the bore in such a manner that the coordinate of the table 51 in the longitudinal axis, which is expected to be positioned at the magnetic field center, actually matches the magnetic field center.

In the next step ST25, the imaging function F5 causes the respective components such as the sequence controller 34 and the gradient coil power supplies 31 to perform MR imaging. Even when a plurality of RF coils 20 are included in the optical image, the above-described procedure enables appropriate determination of the coil elements to be used in MR imaging on the basis of the optical image generated by the optical camera 8.

According to the processing circuitry 40 of the present embodiment, even when a plurality of RF coils 20 are included in the optical image, the coil element to be used in MR imaging can be determined readily, quickly, and accurately on the basis of the optical image generated by the optical camera 8. Thus, the examination time can be significantly shortened as compared with the method that requires separate MR imaging for determining the coil elements to be used in MR imaging.

Further, the processing circuitry 40 according to the present embodiment is also suitable for sequentially performing imaging sequences at a plurality of imaging positions, as exemplified by whole-body imaging. In some cases, MR imaging is performed on each of FOVs corresponding to the respective imaging positions by alternately repeating movement of the table 51 and MR imaging at the current table position in such a manner that each of the imaging positions is positioned at the magnetic field center in sequence, as exemplified by whole-body imaging. Even in such sequential imaging, the arrangement of the coil element 20EL of each RF coil 20 is associated with the position of the table 51 as shown in the middle part of FIG. 9. Thus, even in such sequential imaging, each time the positional relationship between the magnetic field center and the table 51 changes, on the basis of the updated positional relationship after the change and the FOV corresponding to the updated positional relationship after the change, the determination function F4 can readily and accurately determine the coil element(s) included in the FOV as the coil element(s) to be used for MR imaging.

In the above-described embodiment, a description has been given of the case where each RF coil 20 is a wired coil that transmits an RF signal to the RF receiver 32 via the cable 21. When the RF coil 20 is a wireless coil that transmits an RF signal to the RF receiver 32 by wireless communication, the cable 21 and the coil port cannot be used.

When imaging is performed by using a plurality of wireless RF coils, it is desirable to associate each RF coil, which is included in the optical image and is identified in terms of position and orientation on the table 51, with the RF coil that wirelessly transmits the output signal to the system.

In this case, the second acquisition function F2 causes each of the plurality of wireless RF coils to sequentially output a signal wirelessly, and acquires the outputted signal. This signal does not have to be an RF signal. The second acquisition function F2 associates each of the plurality of wireless RF coils that sequentially output signals with each RF coil that is included in the optical image and is identified in terms of position and orientation on the table 51. For example, the second acquisition function F2 causes a wireless RF coil 201w and another wireless RF coil 202W to alternately output a signal such that the wireless RF coil 201w outputs the signal at odd-numbered timings and the wireless RF coil 202w outputs the signal at even-numbered timings. In this case, the second acquisition function F2 associates the wireless RF coil 201w outputting the signal at odd-numbered timings with the head side on the optical image, and associates the wireless coil 202w outputting the signal at even-numbered timings with the foot side coil on the optical image, for example.

Hereinafter, a description will be given of three methods of associating the signals outputted from each of the plurality of wireless RF coils with each RF coil recognized from the optical image.

Figure 10:
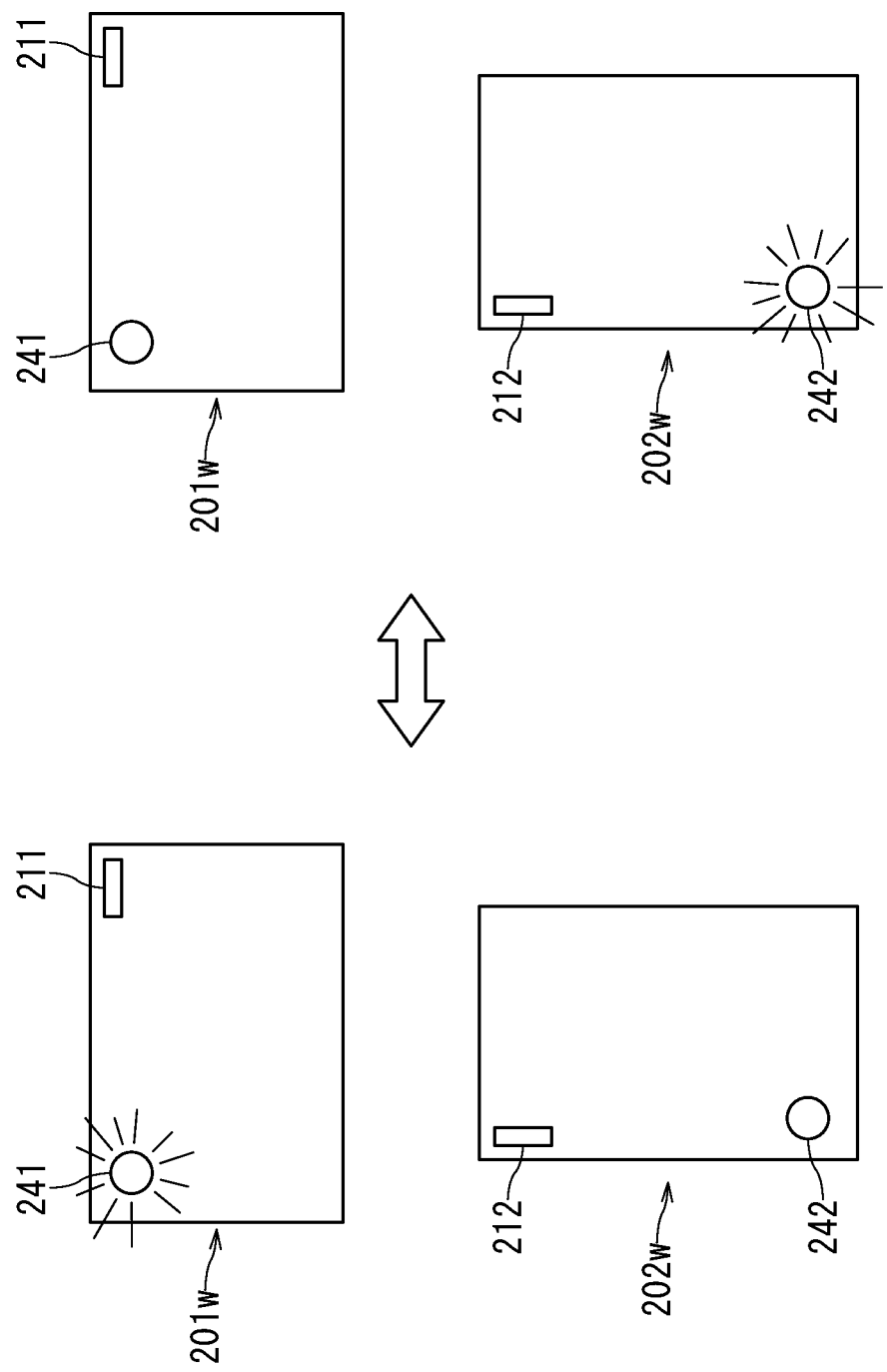
FIG. 10 is a schematic diagram illustrating the first method of associating respective signals of a plurality of wireless RF coils with each RF coil depicted in an optical image.
Figure 11:
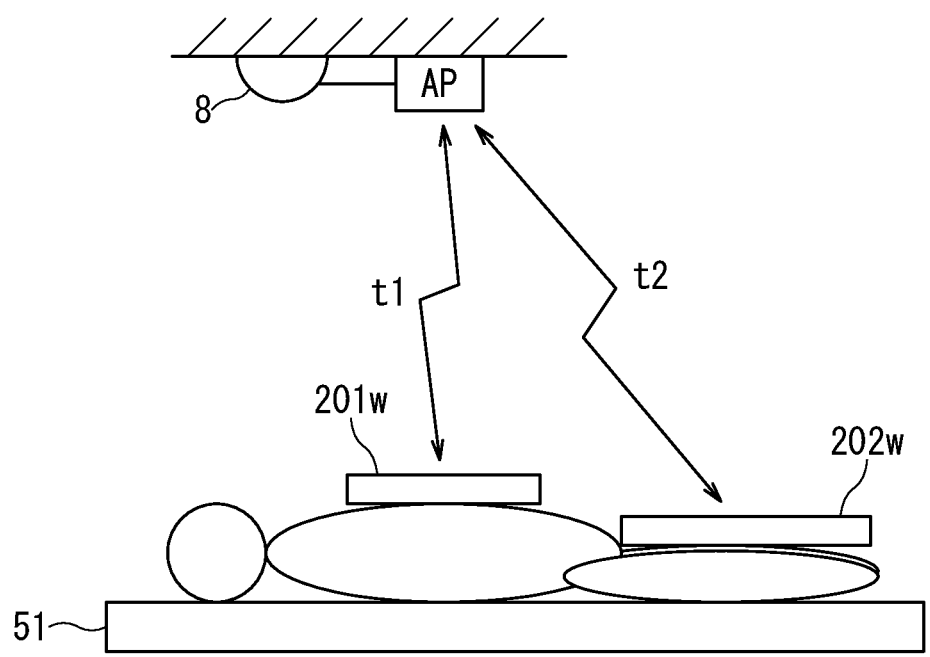
FIG. 11 is a schematic diagram illustrating the second method of associating respective signals of the plurality of wireless RF coils with each RF coil depicted in the optical image.
Figure 12:
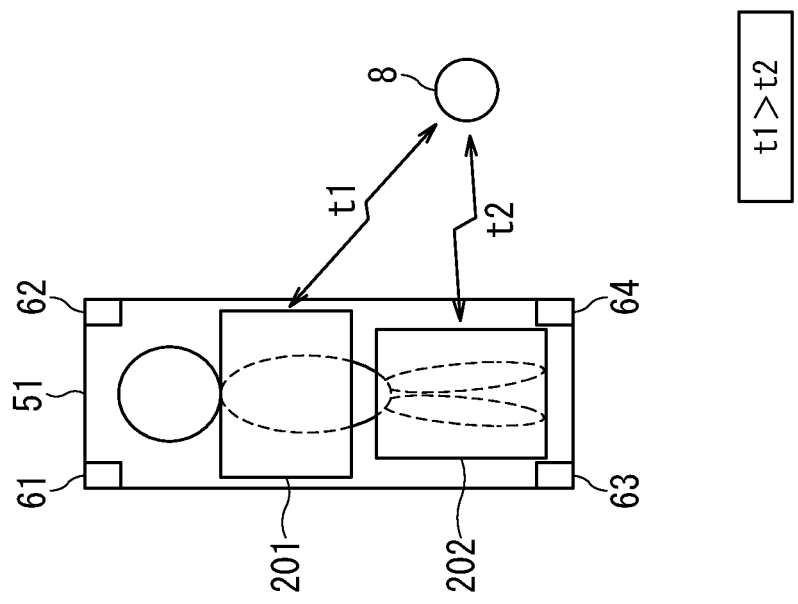
FIG. 12 is a schematic diagram illustrating the third method of associating respective signals of the plurality of wireless RF coils with each RF coil depicted in the optical image.
Figure 12:
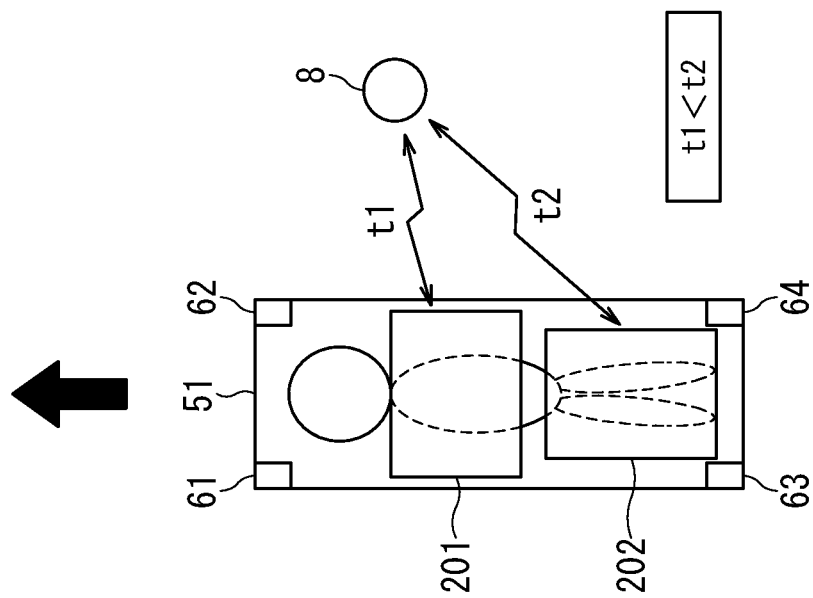

FIG. 10, FIG. 11, and FIG. 12 are schematic diagrams illustrating the first, second, and third methods of associating respective signals of a plurality of wireless RF coils with each RF coil depicted in an optical image, respectively.

The first method is a method of using a light emitter such as an LED provided on the surface of each of the plurality of wireless RF coils. In the first method, the first wireless RF coil 201w includes a light emitter 241 disposed on its surface, and the second wireless RF coil 202w includes a light emitter 242 disposed on its surface. The second acquisition function F2 may cause each of the wireless RF coils (201W, 202W) to wirelessly output a signal in sequence and emit light from its light emitter in synchronization with the signal output so as to acquire the outputted signal (FIG. 10). In this case, the second acquisition function F2 may associate the wireless RF coil outputting the signal acquired at a predetermined timing with the wireless RF coil, light emitter of which emits light in the optical image generated at the predetermined timing.

The second method is a method of installing a wireless coil and a wireless access point AP for wireless communication of the RF receiver 32 inside or near the optical camera 8. In the second method, the second acquisition function F2 causes each of the plurality of wireless RF coils to output a signal in sequence. On the basis of the transfer times t1 and t2 required for the wireless access point AP, which is built in or provided near the optical camera configured to generate optical images, to receive this signal, the second acquisition function F2 associates the coil outputting this signal with one of the plurality of wireless coils depicted in the optical image.

In the case shown in FIG. 11, the optical camera 8 calculates the distance between the wireless access point AP and the wireless coil 201w from the transfer time t1 required for data communication between the wireless access point AP and the wireless RF coil 201w, and calculates the distance between the wireless access point AP and the wireless RF coil 202w from the transfer time t2 required for data communication between the wireless access point AP and the wireless RF coil 202w. The optical camera 8 calculates the position of the wireless RF coil currently in communication with the system on the basis of the acquired distance, and outputs information on the calculated position of the wireless RF coil currently in communication with the system to the acquisition function F2 of the processing circuitry 40.

The third method is a method in which the optical camera 8 receives a transmission signal from each of the wireless RF coils. In the third method, the second acquisition function F2 repeatedly causes each of the plurality of wireless RF coils to output a signal in sequence so as to repeat acquisition of the outputted signal while causing the table 51 to move, and associates the respective wireless RF coils having outputted the signal with the plurality of wireless RF coils depicted in the optical image on the basis of change in transfer time required for receiving the signal from each wireless RF coil.

In the third method, the optical camera 8 does not need a function of analyzing the data of the transmission signals to be received from the wireless RF coils, and only needs to be able to recognize the timing or clock time when the signal is received. While the table 51 is being moved to the magnetic field center, each wireless RF coil alternately sends data to the optical camera 8 at predetermined time intervals. The optical camera 8 receives the signal of the data and recognizes the current position of the table 51 and the clock time at which the signal is received. The delay time until the optical camera 8 receives the signal changes depending on the position of the table 51. Thus, on the basis of the change in delay time of the signal received by the optical camera 8, the processing circuitry 40 can determine the position of the wireless RF coil that is the transmission source of the received signal, as the position on the table 51. Even when there are a plurality of wireless RF coils, under the condition that each wireless RF coil transfers data in a fixed order, the processing circuitry 40 can identify which wireless RF coil the received signal belongs to. Further, the transmission data (which may be a waveform) may be characterized for each wireless RF coil such that the optical camera 8 uses the signal of the transmission data to identify the wireless RF coil having transmitted this signal.

Figure 13A:
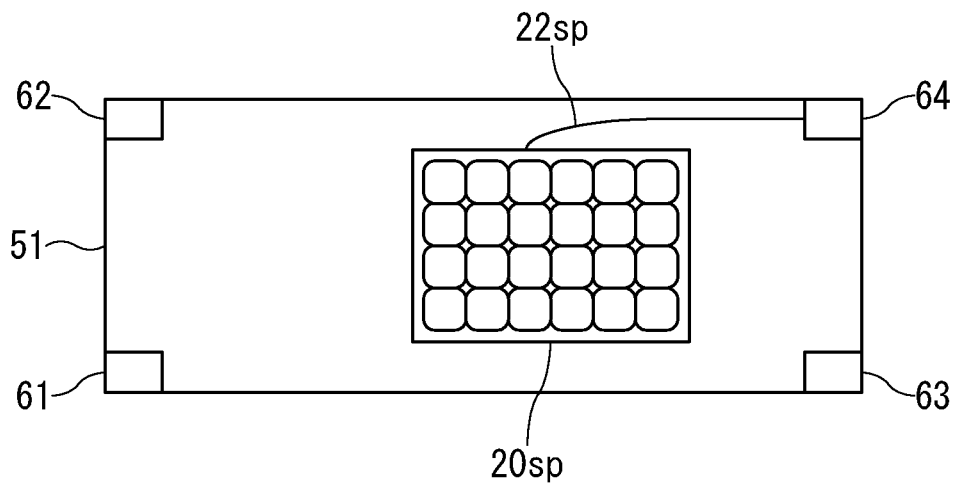
FIG. 13A is a schematic diagram illustrating a spine coil disposed on a table of a bed.
Figure 13B:
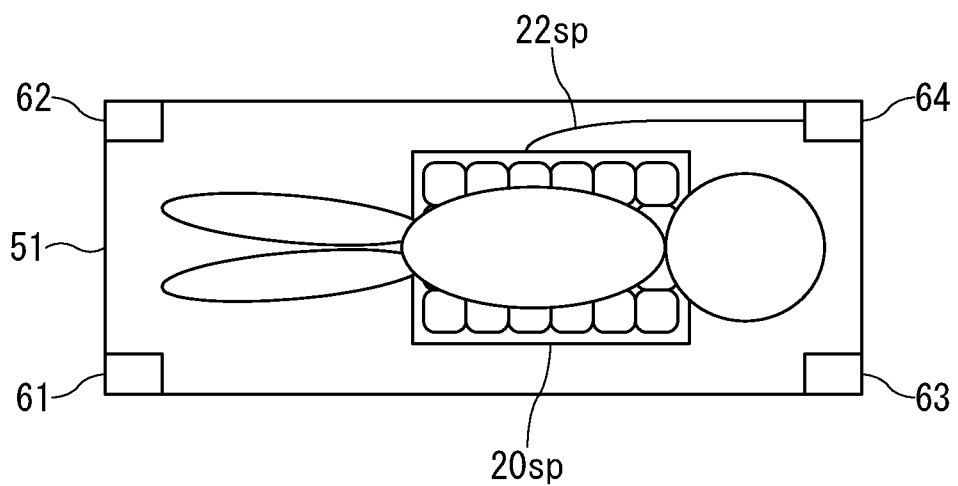
FIG. 13B is a schematic diagram illustrating an object placed on the table on which the spine coil is disposed.

FIG. 13A is a schematic diagram illustrating a spine coil 20sp disposed on the table 51, and FIG. 13B is a schematic diagram illustrating an object placed on the table 51 on which the spine coil 20sp is disposed.

The RF coil 20 according to the present embodiment may be an RF coil to be disposed between the table 51 and the object, such as the spine coil 20sp. As shown in FIG. 13B, once the object is placed on the table 51, it is difficult to grasp the entirety of such a large or long RF coil in the optical image to be generated by the optical camera 8.

Even before the object is placed on the table 51, an RF coil such as the spine coil 20sp once disposed on the table 51 is positionally adjusted by the user in some cases. Thus, it is preferred to acquire the position and orientation of an RF coil such as the spine coil 20sp and the connection destination port of the cable 22sp by using the optical image that depicts the entire RF coil and is generated immediately before the object is placed on the table 51.

Thus, for example, in the case of using the spine coil 20sp, the first acquisition function F1 stars acquiring optical images depicting the spine coil 20sp at a predetermined frame rate before the object is placed on the table 51 (FIG. 13A), and continues the acquisition of these time-sequential optical images. When the object is placed on the table 51, the second acquisition function F2 receives an optical image, which is a frame generated before the placement of the object and is within predetermined frames from the timing of the placement, from the first acquisition function F1. On the basis of the optical image received from the first acquisition function F1, the second acquisition function F2 acquires the disposition (i.e., position and orientation) of the spine coil 20*sp* with respect to the table 51 and the port to which the spine coil 20*sp* is connected. On the basis of the position, orientation, and connection destination port of the spine coil 20*sp*, the second acquisition function F2 may associate each coil element 20EL of the spine coil 20*sp* with the position in the table 51.

According to at least one embodiment described above, the coil element 20EL to be used in MR imaging can be determined on the basis of the optical image generated by the optical camera 8.

In the above-described embodiments, the term "processor" means, for example, a circuit such as a special-purpose or general-purpose CPU (Central Processing Unit), a special-purpose or general-purpose GPU (Graphics Processing Unit), an ASIC, and a programmable logic device including: an SPLD (Simple Programmable Logic Device); a CPLD (Complex Programmable Logic Device); and an FPGA. When the processor is, for example, a CPU, the processor implements various functions by reading out programs stored in a memory and executing the programs.

Additionally, when the processor is, for example, an ASIC, instead of storing the programs in the memory, the functions corresponding to the respective programs are directly incorporated as a logic circuit in the circuit of the processor. In this case, the processor implements various functions by hardware processing in which the programs incorporated in the circuit are read out and executed. Further, the processor can also implement various functions by executing software processing and hardware processing in combination.

Although a description has been given of the case where a single processor of the processing circuitry implements each function in the above-described embodiments, the processing circuitry may be configured by combining a plurality of independent processors which implement the respective functions. When a plurality of processors are provided, the memory for storing the programs may be individually provided for each processor or one memory may collectively store the programs corresponding to the functions of all the processors.

While certain embodiments have been described, these embodiments have been presented by way of example only, and are not intended to limit the scope of the inventions. These embodiments can be implemented in various other aspects, and various omissions, substitutions, changes, and combinations of embodiments can be made without departing from the spirit of the invention. These embodiments and modifications thereof are included in the scope of the invention and the gist thereof, and are also included in the invention described in the claims and the equivalent scope thereof.

What is claimed is:

1. An image processing apparatus comprising:
    processing circuitry configured to:
        acquire an image in which a coil is depicted, the coil including a plurality of coil elements,
        acquire, from the image, information on disposition of the coil and information on orientation of the coil, and
        determine at least one coil element to be used in MR imaging from the plurality of coil elements of the coil, based on the information on the disposition of the coil and the information on the orientation of the coil.

2. The image processing apparatus according to claim 1, wherein the processing circuitry is configured to acquire, from the image, information on a position of the coil with respect to a table as the information on the disposition of the coil, and information on the orientation of the coil with respect to the table from the image as the information on the orientation of the coil.

3. The image processing apparatus according to claim 1, wherein the processing circuitry is configured to:
    set an imaging range and a positional relationship between a magnetic field center and a table based on imaging conditions,
    move the table on which an object is placed based on the positional relationship having been set,
    determine a coil element included in the imaging range from the plurality of coil elements as the coil element to be used in MR imaging, based on the position of the coil with respect to the table, the orientation of the coil with respect to the table, the positional relationship, and the imaging range, and
    perform MR imaging under the positional relationship having been set.

4. The image processing apparatus according to claim 3, wherein the processing circuitry is configured to alternately repeat movement of the table and MR imaging of the object on the table by moving each of imaging positions of the object to the magnetic field center in sequence in such a manner that MR imaging is performed at respective imaging ranges corresponding to the imaging positions, and
    wherein, each time the positional relationship is changed as an updated positional relationship, the processing circuitry determines a coil element included in an imaging range corresponding to the updated positional relationship from the plurality of coil elements as the coil element to be used in MR imaging based on the updated positional relationship and the imaging range corresponding to the updated positional relationship.

5. The image processing apparatus according to claim 1, wherein the processing circuitry is configured to acquire information on the orientation of the coil with respect to a table from the image, based on at least one of a mark attached to the coil, a label attached to the coil, and a shape of the coil.

6. The image processing apparatus according to claim 5, wherein the processing circuitry is configured to acquire information on the orientation of the coil with respect to the table from the image, based on an outlet of a cable of the coil for connecting the coil to a port of the table.

7. The image processing apparatus according to claim 1, wherein:
    the processing circuitry is configured to
        acquire an image depicting a plurality of coils, and
        acquire, from the image, information on disposition of each of the plurality of coils and information on a port to which each of the plurality of the coils is connected, and
    each of the plurality of coils includes a plurality of coil elements.

8. The image processing apparatus according to claim 7, wherein the processing circuitry is configured to:
acquire an image depicting the plurality of coils connected to respective ports via cables, and
acquire information on a connection destination port of each of the plurality of coils from among the respective ports, based on respective positions of the cables depicted in the image depicting the plurality of coils.

9. The image processing apparatus according to claim 7, wherein the processing circuitry is configured to:
acquire, for each of the plurality of coils, an image at a time of connection of a coil to a port via a cable, and
acquire information on a connection destination port for each of the plurality of coils from the image at a time of connection, based on positions of both hands of a user who connects a coil to a port via a cable.

10. The image processing apparatus according to claim 7, wherein the processing circuitry is configured to:
acquire an image depicting the plurality of coils connected to respective ports via cables, and
acquire, for each of the plurality of coils, information on a port closest to a coil from among the ports as information on a connection destination port by using the image depicting the plurality of coils.

11. The image processing apparatus according to claim 7, wherein, when a coil is connected to a port via a cable, the processing circuitry acquires an image depicting a connected coil and further acquires information on disposition of the connected coil and a connection destination port of the connected coil, from the image depicting the connected coil.

12. The image processing apparatus according to claim 11, wherein, when a table on which an object is placed moves to a magnetic field center, the processing circuitry reacquires an image depicting the connected coil immediately before movement of the table and reacquires information on the connection destination port of the connected coil from the reacquired image.

13. The image processing apparatus according to claim 7, wherein the processing circuitry is configured to ask a user whether the acquired port to which each of the plurality of coils is connected is correct or not, immediately before movement of a table on which an object is placed to a magnetic field center.

14. The image processing apparatus according to claim 7, wherein the processing circuitry is further configured to
acquire information on a port to which each of the plurality of coils is connected, and
associate each of the plurality of coils with the port.

15. An MRI apparatus comprising a gantry and the image processing apparatus according to claim 1.

16. An image processing system comprising:
an optical camera configured to acquire the image by optical imaging; and
the MRI apparatus according to claim 15.

17. An image processing apparatus comprising:
processing circuitry configured to:
acquire an image in which a coil is depicted, and
acquire, from the image, information on disposition of the coil and information on orientation of the coil, wherein
the processing circuitry is further configured to
acquire an image depicting a plurality of coils, and
acquire, from the image, information on disposition of each of the plurality of coils and information on a port to which each of the plurality of the coils is connected, wherein each of the plurality of coils includes a plurality of coil elements,
each of the plurality of coils is a wireless RF coil configured to wirelessly output a received MR signal,
each of the plurality of coils is provided with a light emitter, and
the processing circuitry is further configured to
sequentially acquire a signal from each of the plurality of coils by causing each of the plurality of coils to output the signal in sequence and emit light from the light emitter in synchronization with output of the signal, and
associate a coil outputting an acquired signal with a coil emitting light from the light emitter from among the plurality of the coils depicted in the image depicting a plurality of coils.

18. An image processing apparatus comprising:
processing circuitry configured to:
acquire an image in which a coil is depicted, and
acquire, from the image, information on disposition of the coil and information on orientation of the coil, wherein
the processing circuitry is further configured to
acquire an image depicting a plurality of coils, and
acquire, from the image, information on disposition of each of the plurality of coils and information on a port to which each of the plurality of the coils is connected, wherein each of the plurality of coils includes a plurality of coil elements,
each of the plurality of coils is a wireless RF coil configured to wirelessly output a received MR signal, and
the processing circuitry is further configured to
cause each of the plurality of coils to output a signal in sequence, and
associate a coil outputting the signal with one of the plurality of coils depicted in the image depicting a plurality of coils, based on a transfer time required for a wireless access point to receive the signal, the wireless access point being built in or provided near an optical camera that generates the image depicting the plurality of coils.

19. An image processing apparatus comprising:
processing circuitry configured to:
acquire an image in which a coil is depicted, and
acquire, from the image, information on disposition of the coil and information on orientation of the coil, wherein
the processing circuitry is further configured to
acquire an image depicting a plurality of coils, and
acquire, from the image, information on disposition of each of the plurality of coils and information on a port to which each of the plurality of the coils is connected, wherein each of the plurality of coils includes a plurality of coil elements,
each of the plurality of coils is a wireless RF coil configured to wirelessly output a received MR signal, and
the processing circuitry is further configured to
repeatedly cause each of the plurality of coils to output a signal in sequence and repeat acquisition of the signal while causing a table to move, and
associate a coil having outputted the signal with one of the plurality of the coils depicted in the image depicting the plurality of coils, based on change in transfer time required for receiving the signal from each coil.

20. An image processing apparatus comprising:
processing circuitry configured to:
  acquire an image in which a coil is depicted, and
  acquire, from the image, information on disposition of the coil and information on a port to which the coil is connected, wherein
the coil is a spine coil to be disposed on a table before an object is placed on the tabled, and
the processing circuitry is further configured to
  start acquisition of images depicting the spine coil at a predetermined frame rate before the object is placed on the table,
  extract an image that is a frame generated before placement of the object on the table and is within predetermined frames from a timing of the placement, when the object is placed on the table, and
  acquire, from the extracted image, disposition of the spine coil and a port to which the spine coil is connected.

* * * * *